(12) United States Patent
Kühm et al.

(10) Patent No.: US 11,381,774 B2
(45) Date of Patent: Jul. 5, 2022

(54) MICROSCOPE SYSTEM AND METHOD FOR OPERATING A MICROSCOPE SYSTEM

(71) Applicant: CARL ZEISS MICROSCOPY GMBH, Jena (DE)

(72) Inventors: Andreas Kühm, Dornburg-Camburg (DE); Nico Presser, Jena (DE)

(73) Assignee: Carl Zeiss Microscopy GmbH, Jena (DE)

(*) Notice: Subject to any disclaimer, the term of this patent is extended or adjusted under 35 U.S.C. 154(b) by 0 days.

(21) Appl. No.: 16/603,960

(22) PCT Filed: Mar. 29, 2018

(86) PCT No.: PCT/EP2018/058266
§ 371 (c)(1),
(2) Date: Oct. 9, 2019

(87) PCT Pub. No.: WO2018/188978
PCT Pub. Date: Oct. 18, 2018

(65) Prior Publication Data
US 2020/0162696 A1    May 21, 2020

(30) Foreign Application Priority Data

Apr. 13, 2017  (DE) .......................... 102017108016.3

(51) Int. Cl.
*H04N 5/91* (2006.01)
*H04N 5/765* (2006.01)
(Continued)

(52) U.S. Cl.
CPC ............. *H04N 5/91* (2013.01); *G02B 21/365* (2013.01); *G06V 40/13* (2022.01); *H01J 37/22* (2013.01);
(Continued)

(58) Field of Classification Search
CPC .......... G16H 30/40; H04N 5/91; H04N 5/765; H04N 7/12; G06K 9/00013; G02B 21/365;
(Continued)

(56) References Cited

U.S. PATENT DOCUMENTS 5,432,871 A    7/1995  Novik
6,711,283 B1   3/2004  Soenksen
(Continued)

FOREIGN PATENT DOCUMENTS

CN    105915793 A    8/2016
JP    2016009955 A   1/2016
(Continued)

OTHER PUBLICATIONS

German Search Report for DE 10 2017 108 016.3 dated Nov. 22, 2017.
(Continued)

*Primary Examiner* — Jeff A Burke
*Assistant Examiner* — Sihar A Karwan
(74) *Attorney, Agent, or Firm* — Duane Morris LLP

(57) ABSTRACT

A microscope system includes a microscope with at least one microscope sensor. Each microscope sensor has a measurement device for recording sample signals; an analog-to-digital converter for converting recorded sample signals to digital data; a data compression device which produces a compressed data stream from the digital data; and a data output interface, which outputs the compressed data stream and a raw data stream that comprises digital data that were not compressed. The microscope system additionally includes a user computer to which the compressed data stream is transmitted and also a data memory to which the raw data stream is transmitted. The user computer calculates real-time images from the compressed data stream and reads (Continued)

and processes the raw data stream from the data memory for subsequent data analysis. In addition, a method for operating such a microscope system is described.

13 Claims, 1 Drawing Sheet

(51) Int. Cl.
  *H04N 7/12* (2006.01)
  *G02B 21/36* (2006.01)
  *H01J 37/22* (2006.01)
  *G06V 40/13* (2022.01)
  *G06F 3/0482* (2013.01)

(52) U.S. Cl.
  CPC .............. *H04N 5/765* (2013.01); *H04N 7/12* (2013.01); *G06F 3/0482* (2013.01); *H01J 2237/226* (2013.01)

(58) Field of Classification Search
  CPC .... G02B 21/24; H01J 37/22; H01J 2237/226; H01J 37/244; H01J 2237/22; H01J 37/26; G06F 3/0482; G01Q 30/04
  USPC ............................................ 348/79; 382/133
  See application file for complete search history.

(56) References Cited

U.S. PATENT DOCUMENTS

| | | | |
|---|---|---|---|
| 8,718,451 B1* | 5/2014 | Linzer | ................. H04N 9/7921 386/328 |
| 2004/0042668 A1 | 3/2004 | Kaplinsky et al. | |
| 2011/0122242 A1* | 5/2011 | Garud | .................... G16H 30/40 348/79 |
| 2014/0184778 A1 | 7/2014 | Takayama | |
| 2014/0368514 A1 | 12/2014 | Ruger et al. | |
| 2016/0370264 A1 | 12/2016 | Campbell | |
| 2017/0094095 A1 | 3/2017 | Crandall et al. | |

FOREIGN PATENT DOCUMENTS

| | | |
|---|---|---|
| WO | 9606502 A1 | 2/1996 |
| WO | 2004077338 A2 | 9/2004 |
| WO | 2017193796 A1 | 11/2017 |

OTHER PUBLICATIONS

International Search Report for PCT/EP2018/058266 dated Jul. 25, 2018.
Chinese Office Action for 201880024084.9 dated Apr. 16, 2021 with translation.
Japanese Office Action for 2019-552099 dated Mar. 11, 2022 with translation.

* cited by examiner

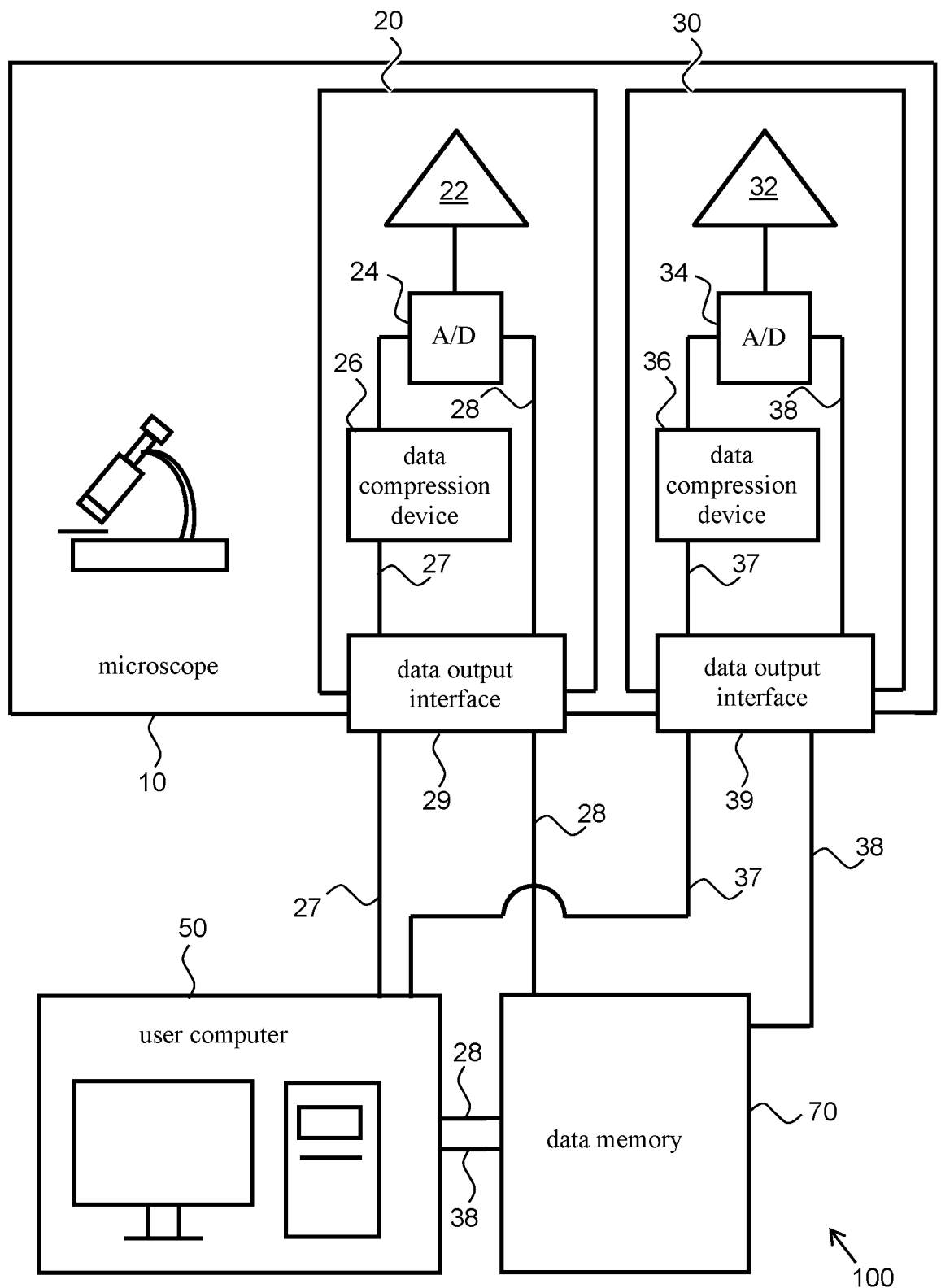

MICROSCOPE SYSTEM AND METHOD FOR OPERATING A MICROSCOPE SYSTEM

RELATED APPLICATIONS

The present application is a U.S. National Stage application of International PCT Application No. PCT/EP2018/058266 filed on Mar. 29, 2018, which claims priority benefit of German Application No. DE 10 2017 108 016.3 filed on Apr. 13, 2017, the contents of each are incorporated by reference in their entirety.

TECHNICAL FIELD OF THE INVENTION

The present invention relates in a first aspect, to a microscope system.

In a second aspect, the invention relates to a method for operating a microscope system.

BACKGROUND OF THE INVENTION

A generic microscope system comprises a microscope that comprises at least one microscope sensor for examining a sample. The microscope can be, for example, a light microscope, an electron microscope, a scanning force microscope, an X-ray microscope, a magnetic resonance microscope or a combination thereof. The sample can be of any type, for example it may be a biological sample, an electronic component, a liquid or a solid. Each microscope sensor of the generic microscope system in each case comprises: a measurement device for recording sample signals, an analog-to-digital converter for converting recorded sample signals to digital data, and a data output interface. The type of the microscope sensor can differ depending on the microscope; for example, a microscope sensor can comprise a light sensor, a camera, a deflectable probe or cantilever, a measurement device for electromagnetic radiation in a specific spectral range, such as X-rays, or a magnetic sensor, for example a SQUID or Hall sensor. The generic microscope system additionally comprises a user computer that can be situated at a location remote from the microscope or can alternatively be integrated (embedded) in the microscope. The user computer is communicatively connected to the microscope or to the remaining microscope components so as to receive data that are output via the data output interface of the microscope sensor. In addition, the user computer is set up for calculating and displaying sample images based on the received data. The user computer can also provide a control command input apparatus via which a user can input a command for controlling the microscope, for example via a keyboard, a joystick, a computer mouse or a touch-sensitive screen.

In a generic method for operating a microscope, at least one microscope sensor of a microscope is correspondingly used to examine a sample. A measurement device of a respective microscope sensor in this ease records sample signals. An analog-to-digital converter of a respective microscope sensor converts recorded sample signals to digital data. A data output interface of a respective microscope sensor outputs data to a user computer. The user computer then calculates sample images on the basis of received data and displays them.

For a sample examination that is as precise as possible, the microscope sensor(s) produce(s) large amounts of data which are transferred to the user computer. Data rates can be in the region of several gigabits per second, wherein the amounts of data produced increase further and can also be produced by a microscope sensor at for example 20-30 GBit/s. The user computer must process received data extremely quickly to present for example a real-time image of the sample. The requirements concerning the user computer are consequently very high, as a result of which the technical implementation and the associated costs pose a problem.

It is therefore possible to consider it an object of the invention to specify a microscope system and a method for operating a microscope system which make possible sample examination that is as precise as possible and which manage amounts of data that are obtained in the process as simply and efficiently as possible.

SUMMARY OF THE INVENTION

This object is achieved by means of the microscope system having the features of claim 1 and by means of the method having the features of claim 12.

Advantageous variants of the microscope system according to the invention and of the method according to the invention are subjects of the dependent claims and will additionally be explained in the description that follows.

In the microscope system of the above-mentioned type, each microscope sensor comprises, according to the invention, in each case a data compression device which is configured to produce a compressed data stream through (in particular lossy) compression of the digital data of the analog-to-digital converter. Compression can, for one, designate a reduction in the data rate with substantially the same information content, for example in the case of a video compression algorithm or PEG compression. However, compression can also be understood to mean not utilizing part of the recorded data for the compressed data stream, for example by virtue of the fact that only a single color channel of recorded color images, that is to say a black-and-white image, is used for the compressed data stream. Each microscope sensor is additionally configured to output via its data output interface the respective compressed data stream and also a raw data stream comprising digital data that were not compressed by the data compression device or were at least compressed to a lesser extent than the compressed data stream. The microscope sensor thus produces from the same recorded sample data two mutually differing data streams with a different data rate "on-the-fly," that is to say at the same time and directly after the data recording. Both data streams are output at the same time, or in alternation for example using time-division multiplexing. The user computer and the microscope are connected such that the compressed data stream is transmitted to the user computer, wherein the raw data stream is transmitted to a data memory that, is connected to the microscope. In particular, only the compressed data stream and not the raw data stream is thus transmitted to the user computer. The user computer is then configured to calculate and present as sample images, real-time images from the compressed data stream. For a subsequent data analysis, the user computer is able to read and process the raw data stream from the data memory, or a raw data stream derived therefrom from the data memory.

Accordingly, in the above-mentioned generic method, provision is made according to the invention
  that a data compression device of a respective microscope sensor produces a compressed data stream by compressing the digital data of the analog-to-digital converter,
  that the respective compressed data stream and also a raw data stream comprising digital data that were not compressed or were at least compressed to a lesser extent than the compressed data stream are output via the data output interface, that the compressed data stream is transmitted to the user computer, that the raw data stream is transmitted to a data memory, that the user computer calculates and presents real-time images from the compressed data stream and reads and processes the raw data stream from the data memory, or a raw data stream derived therefrom from the data memory, for a subsequent data analysis.

In known microscope systems, the user computer receives the raw data stream and must create real-time images therefrom, and the user computer must also store the raw data stream. While the calculation and presentation of real-time images from the raw data stream alone places enormous demands on the user computer, simultaneous writing or transferring of the raw data stream into or to a data memory constitutes a further relevant strain on the user computer. These disadvantages of the prior art are avoided or alleviated by the invention: For example, the user computer does not need to process the large amounts of data of the raw data stream for creating real-time images; rather, the user computer to this end receives a data stream that is reduced by comparison, specifically the aforementioned compressed data stream. As a result, the demands placed on the user computer significantly decrease. Additionally, the user computer in the invention is preferably no longer burdened with different tasks at the same time, because the user computer is not used for storing the raw data stream and preferably the transfer of data from the microscope sensor to the data memory does not run via the user computer either. For example, considering the high data rate of the raw data stream, even a transfer of data would constitute a significant load on the user computer. Nevertheless, a loss in quality for the sample examination does not exist, because the more precise raw data (and not the compressed data) are used for processing and presenting the recorded sample data, which no longer takes place in real time.

Accordingly, the data memory is preferably connected to the at least one microscope sensor without the user computer being connected therebetween. The user computer is thus arranged such that it is not responsible for storing or transferring the raw data stream to the data memory. The data memory can comprise for example one or more HDD or SSD drives or comparable data memories and an associated computing device for receiving, writing and transferring data.

What is relevant for relieving the load of the user computer in a manner according to the invention is that the microscope sensor produces two data streams from the recorded sample data. To this end, the microscope sensor can comprise specifically designed electronic circuits that are relatively cost-effective as compared to a high-performance user computer which would have to process the raw data stream without hardware components that are specifically adapted for the respective microscope sensor.

The analog-to-digital converter of a microscope sensor and the data compression device thereof can, for efficient data transmission, be arranged in the same housing, in particular on the same circuit board or on two adjacent, connected circuit boards. In principle, however, the analog-to-digital converter and the data compression device can also be arranged spatially further apart and the data compression device can be situated spatially at the user computer. However, in this case, provision is nevertheless made for components of the user computer that are used for processing the compressed data stream and for presenting the real-time images from the compressed data stream not also to be used for storing the raw data stream or receiving and transferring the raw data stream from the data output interface of the microscope sensor.

A microscope sensor can, as discussed in the introductory part of the description, vary depending on the microscope. In each case, it comprises a measurement device which can be, for example, light-sensitive or sensitive to other electromagnetic radiation or fields. The above-mentioned recorded sample signal can thus for example be a sample image or a frequency-dependent intensity. The signal produced by the measurement device is initially present in analog form and is then converted to a digital signal by an analog-to-digital converter. Depending on type of measurement device, a single component can form both the measurement device and the analog-to-digital converter, as is possible for example in the case of CMOS sensors. Generally, analog-to-digital converter is to be understood to mean a component that produces a digital signal (in which the measurement value is coded by a sequence of high and low signal levels) from an analog signal (in which the signal height indicates a measurement value). The data output by the analog-to-digital converter are here referred to as the raw data stream. Generally, further data processing steps which are not mentioned here can be provided. For example, the raw data stream can be changed before it is transmitted to the data compression device or before it is output at the data output interface. Processing the raw data at the data memory is also possible before such a processed raw data stream is transmitted from the data memory to the user computer. What is relevant is only that a data rate of the raw data stream and of a processed raw data stream is greater than a data rate of the compressed data stream. If the following text makes reference to the raw data stream, this term can also be understood to mean a processed raw data stream having a data rate that is higher than that of the compressed data stream.

The data compression device of a microscope sensor is formed by electronic components and possibly software with which the incoming raw data stream is processed and reduced in terms of data rate. The data compression device operates in real time. Real-time can be understood to mean a delay of at most 20 seconds, preferably at most 5 seconds. The delay can be defined as starting at the time point of the data recording using the measurement device up to the data output, that is to say in particular the data output of the data compression device or the data output of the user computer for displaying a real-time image. A real-time image can be understood to mean one or more two-dimensional sample images, a three-dimensional sample image, a diagram showing for example a measured light intensity as a function of the light wavelength, or correlated data, that is to say temporal events that are optionally converted to image data only at a later point.

The data output interface of each microscope sensor can be a connection for one or more cables via which the two data streams are output. In principle, radio transmission of the two data streams is also conceivable as data output interface. It may be preferred that each microscope sensor comprise a separate cable connections for outputting the compressed data stream and the raw data stream, in which case two cable connections are thus present. Alternatively, a microscope sensor can also have a common cable connection for outputting the compressed data stream and the raw data stream, wherein at least one data splitter is provided between the microscope sensors and the user-computer. The data splitter can also be referred to as "routing interface" and transmits the compressed data stream alone to the user computer while it transfers the raw data stream alone to the data memory.

A user computer is to be understood to mean a computer via which a user can view and evaluate recorded sample data. Control of the microscope may also be possible via the user computer. It is frequently necessary to intervene in the measurement process during an analysis and to adapt specific microscope parameters for a desired result; a life data stream, that is to say the compressed data stream, is extremely helpful in this respect. The user computer comprises generally one or more processors (CPUs), a non-volatile data memory, a main memory, and an associated screen.

If a plurality of microscope sensors are present, these can be of the same type or have different forms. The microscope sensors can in particular differ in terms of their respective measurement device. For example, one measurement device can comprise a camera for a light microscope, while another measurement device can comprise a spectrometer. In particular, in microscopes that constitute a combination of a light microscope and an electron microscope, the measurement devices and associated therewith also the type of the recorded sample data differ. For efficient, data reduction, however, it is especially the type of the sample data that is relevant. For example, 2D images can be efficiently compressed in a different way than spectral data. Therefore, the data compression devices of the microscope sensors preferably vary depending on the type of the respective measurement device.

For example, the measurement device of one of the microscope sensors can be configured for image recording, and the data compression device of said microscope sensor can be configured for compressing image data. The measurement device of one of the other microscope sensors can be configured for spectral data recording, and the data compression device of said microscope sensor can be configured for compressing spectral data. Here, the hardware components and/or the compression algorithms used for compressing image data and for compressing spectral data differ.

By using specific hardware for compression rather than a general CPU as is conventionally the case in a user computer, it is possible to obtain the data required for real-time presentation significantly faster and more efficiently. In particular, the data compression devices of the microscope sensors can comprise programmable logic circuits, in particular FPGAs (field programmable gate arrays) or ASICs (application-specific integrated circuits) programmed for compressing the digital data. Depending on the type of the measurement device of a microscope sensor, different microscope sensors can consequently also comprise differently programmed FPGAs or ASICs.

In one example for data compression, at least one data compression device of the microscope sensors is configured to use only a portion of sample images from recorded sample images for the compressed data stream. For example, only every n-th images is used, with n being an integer greater than 1; for example, only every 10th image is used for the compressed data stream. This procedure is extremely efficient because a main objective is not compression of data that is as perfect as possible, but to provide sufficient image quality for real-time processing with moderate equipment costs. Alternatively or additionally, at least one data compression device of the microscope sensors can be configured for reducing a bit depth of recorded sample signals that were digitized by the A/D converter to produce the compressed data stream. For example, the A/D converter can be embodied to output a recorded sample signal, for example a light intensity, as a digital signal having a bit depth of 32 bits (generally n bits), The data compression device in this example reduces the bit depth of the digital signal, for example from 32 bits to 12 bits. If the measurement devices of different microscope sensors differ, it is also possible for one data compression device as described above to be configured for reducing the bit depth while another one of the data compression devices is configured for using only every n-th image.

While generally any desired type of data compression can be performed, it may be more cost-effective and faster if the data compression device is configured to produce the compressed data stream by way of lossy compression of the digital data of the analog-to-digital converter. In particular, it is possible by contrast that the raw data stream that is output at the data output interface is not compressed in lossy fashion, or in any case only in a manner such that the data rate thereof continues to be greater than that of the compressed data stream.

The user computer can comprise a data input apparatus via which a user is able to select from the real-time images. The user computer is furthermore configured, in accordance with a selection by a user, to load a portion of the raw data stream corresponding to the selection from the data memory and to process and output it. For example, a user may select data of interest, and for the corresponding sample signals the associated raw data are loaded by the user computer. This selection can for example be a temporal selection, that is to say recorded sample data between a start time point and an end time point. Alternatively or additionally, the selection can also represent an image section from a recorded real-time image. Provision may be made for the user computer to stop the processing and presentation of the compressed data stream when a user has performed an aforementioned selection so as to dedicate the entire available computing power to loading, processing and outputting the corresponding portion of the raw data stream.

Similarly, provision may be made for the raw data stream or a part thereof to be transmitted from the data memory to the user computer only when the recording of sample signals by the at least one measurement device has terminated and no more compressed data stream is transferred from the at least one microscope sensor to the user computer. In this way it is ensured that no double load and overload of the user computer occurs.

The user computer can also be configured to store the received compressed data stream for processing and presentation in a volatile data memory (for example RAM or CPU internal memory) and to not store, or only temporarily store, the received compressed data stream in a non-volatile data memory (for example HDD or SSD memory). Since the compressed data stream only serves to present a real-time image and possibly for offering possible selections to the user, permanent data storage is not necessary. For this reason, the user computer preferably automatically and continuously deletes a past portion of the compressed data stream, for example when the temporarily stored compressed data stream reaches a specific data size or a specific age.

In particular when a user has made a selection from the real-time images on the user computer, it is necessary to identify the corresponding data from the raw data stream. For this reason, provision may be made for the microscope sensors to be configured to store markers in the compressed data stream and in the raw data stream for the purposes of assigning which information in the compressed data stream corresponds to which information in the raw data stream. The markers can be an identifier (ID) that is contained in, or added to, recorded sample signals and is kept both in the raw data stream and in the compressed data stream. For example, the markers can be formed by a counter reading with which recorded sample signals or sample images are numbered starting from a starting point. Alternatively, the markers can also be timestamps with which the sample signals or the two data streams are provided. The user computer is now configured, in accordance with the selection by the user, to ascertain the portion of the raw data stream, corresponding to the selection, with the aid of the markers. This selection alone is now processed and presented by the user computer.

The optional features described of a microscope system according to the invention are also to be interpreted to be variants of the method according to the invention, and vice versa.

BRIEF DESCRIPTION OF THE FIGURE

Further advantages and features of the invention will be described below with reference to the appended schematic FIGURE. Here:

FIG. 1 shows a schematic illustration of an exemplary embodiment of a microscope system according to the invention.

DETAILED DESCRIPTION OF THE EMBODIMENTS

FIG. 1 schematically illustrates an exemplary embodiment of a microscope system 100 according to the invention. The microscope system 100 comprises a microscope 10, which may be for example a light microscope, such as a laser scanning microscope, or in principle any other microscope. The microscope system 100 furthermore comprises a user computer 50 that is remote from the microscope 10. Said user computer receives recorded sample data from the microscope 10 and presents them on a screen. In addition, the user computer can be configured to control the microscope 10, for example to start and terminate a sample examination or a data recording or to adjust microscope parameters, in particular illumination or sample stage position.

The microscope 10 comprises one or more microscope sensors 20, 30, While two microscope sensors 20, 30 are illustrated in FIG. 1, it is also possible to use any other number. Each microscope sensor 20, 30 comprises a measurement device 22, 32 for recording sample signals, for example a camera, an interferometer or a spectrometer and/or a light detector. Each microscope sensor 20, 30 additionally comprises an analog-to-digital converter 24, 34, which converts recorded analog sample signals of the associated measurement device into digital data. Each microscope sensor 20, 30 outputs data via a data output interface 29, 39.

While conventionally a microscope sensor produces and outputs only a single data stream from recorded sample signals, in accordance with the invention, every microscope sensor 20, 30 produces two different data streams from its recorded sample signals, that is to say from one and the same data, and outputs both data streams. The two data streams differ in terms of their data rate. The data stream having a smaller data rate is referred to as the compressed data stream 27, 37 and is produced from the digital data of the A/D converter 24, 34 using a data compression device 26, 36. The larger of the two data streams is referred to as the raw data stream 28, 38. In principle, the raw data stream does not have to be identical to the output data of the A/D converter 24, 34, but can likewise be processed; but it is relevant here that the data rate is greater than in the case of the respective compressed data stream 27, 37.

Each microscope sensor 20, 30 then outputs the respective raw data stream 28, and the respective compressed data stream 27, 37 via a data output interface 29, 39.

The compressed data stream 27, 37 is transmitted to the user computer 50, processed thereby and presented on a screen. By contrast, the raw data stream 28, 38 is not transmitted to the user computer 50, but to a data memory 70, where the raw data stream 28, 38, or a processed raw data stream 28, 38 that has been produced from the former by the data memory 70, is stored. Advantageously, the user computer 50 can particularly quickly present a sample image because it needs to process only the smaller amount of data of the compressed data stream 27, 37. In addition, the user computer 50 does not deal with storing or transmitting the raw data stream 28, 38. Consequently, the user computer 50 can present sample images as real-time images. The real-time images have a poorer image quality or lower time resolution than sample images that can be obtained from the raw data stream 28, 38. The real-time image can also serve as a preview image with which a user can monitor a measurement operation or with which a user can select data of interest. If the user computer 50 longer receives and processes a compressed data stream 27, 37, it can load the raw data stream 28, 38 from the data memory 70 and process and output or present it for a subsequent data analysis (that is to say no longer in real-time or later than the presentation of the corresponding real-time images).

Consequently, the user computer 50 can display real-time images even with a comparatively cost-effective setup, irrespective of how large a raw data stream 28, 38 of a microscope sensor 20, 30 is. The data compression devices 26, 36 can be formed by specific hardware for data compression, for example correspondingly programmed FPGAs or ASICs, such that even in consideration of these costs the layout in terms of apparatus is lower and more cost efficient than if a user computer had to receive the raw data stream directly and use it to present real-time images. In addition, in the illustrated embodiment, there is no need of placing a double load on the user computer as part of which the user computer would not only perform real-time presentation but also transmission of the raw data stream to a data memory.

Therefore, it is advantageously possible for the invention to provide a microscope system 100 that permits use of extremely high sample data rates and at the same time offers real-time presentation of the sample data without the outlay in terms of apparatus becoming unduly great.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE SIGNS

100 Microscope system
10 Microscope 20, 30 Microscope sensor
22, 32 Measurement device
24, 34 Analog-to-digital converter
26, 36 Data compression device
27, 37 Compressed data stream
28, 38 Raw data stream
29, 39 Data output interface
50 User computer
70 Data memory

What is claimed is:

1. A microscope system, comprising:
a microscope having at least one microscope sensor for examining a sample, wherein each microscope sensor comprises:
a measurement device for recording sample signals,
an analog-to-digital converter for converting recorded sample signals to digital data; and
a data output interface,
a user computer, communicatively connected to said microscope for receiving data output via the data output interface of the microscope sensor, and which is configured for calculating and displaying sample images based on the received data;
wherein each microscope sensor comprises a data compression device, configured to produce a compressed data stream by compressing the digital data of the analog-to-digital converter;
each microscope sensor being configured to output, via its data output interface, the respective compressed data stream and a raw data stream comprising digital data that were not compressed or were compressed to a lesser extent than the compressed data stream,
the user computer and the microscope being connected such that the compressed data stream is transmitted from the microscope to the user computer in real-time whereas the raw data stream is not transmitted to the user computer in real-time;
a data memory connected to the microscope such that the raw data stream is transmitted to the data memory;
said user computer configured to calculate and present real-time images from the compressed data stream and to read and process the raw data stream from the data memory, or a raw data stream derived therefrom from the data memory, for a subsequent data analysis.

2. The microscope system as claimed in claim 1,
wherein the data memory is connected to the at least one microscope sensor without the user computer being connected therebetween, as a result of which the user computer is not responsible for storing or transmitting the raw data stream to the data memory.

3. The microscope system as claimed in claim 1,
wherein the user computer comprises a data input apparatus via which a user is able to make a selection from the real-time images,
the user computer being configured, in accordance with a selection by a user, to load a portion of the raw data stream, corresponding to the selection, from the data memory and to process and output it.

4. The microscope system as claimed in claim 1,
wherein the user computer is configured to
store the received compressed data stream for processing and presentation in a volatile data memory, and
not store the received compressed data stream in a non-volatile data memory, or store it only temporarily.

5. The microscope system as claimed in claim 1,
wherein the data compression device is configured to produce the compressed data stream by lossy compression of the digital data of the analog-to-digital converter, and
the raw data stream output at the data output interface is not lossy, or at least less lossy than the compressed data stream.

6. The microscope system as claimed in claim 5,
wherein the microscope sensors are configured to store markers in the compressed data stream and in the raw data stream for the purposes of assigning which information in the compressed data stream corresponds to which information in the raw data stream, and
the user computer being configured, in accordance with the selection by the user, to ascertain a portion of the raw data stream corresponding to the selection by the user with the aid of the markers.

7. The microscope system as claimed in claim 1,
wherein the microscope comprises a plurality of microscope sensors that differ in terms of their respective measurement device, and
the data compression devices of the microscope sensors differ in dependence on a type of the respective measurement device.

8. The microscope system as claimed in claim 7,
wherein the measurement device of one of the microscope sensors is configured for image recording, and the data compression device of said microscope sensor being configured for compressing image data, and
the measurement device of one of the other microscope sensors is configured for spectral data recording, and the data compression device of said microscope sensor is configured for compressing spectral data.

9. The microscope system as claimed in claim 1,
wherein the data compression devices of the microscope sensors comprise programmable logic circuits programmed for compressing the digital data.

10. The microscope system as claimed in claim 1,
wherein at least one data compression device of the microscope sensors is configured to at least one of: use only a portion of sample images from recorded sample images for the compressed data stream,
or
reduce a bit depth of recorded sample signals to produce the compressed data stream.

11. The microscope system as claimed in claim 1,
wherein each microscope sensor comprises one of: separate cable connections for outputting the compressed data stream and the raw data stream,
or a common cable connection for outputting the compressed data stream and the raw data stream, wherein at least one data splitter is provided between the microscope sensors and the user computer, wherein the data splitter is configured to transmit the compressed data stream alone to the user computer and transmit the raw data stream alone to the data memory.

12. A method for operating a microscope system, comprising at least the following processes:
examining a sample with at least one microscope sensor of a microscope comprising:
recording sample signals with a measurement device of a respective microscope sensor;
converting recorded sample signals into digital data with an analog-to-digital converter of a respective microscope sensor; and outputting data to a user computer with a data output interface of a respective microscope sensor;

wherein the user computer calculates and displays sample images on the basis of received data;

a data compression device of a respective microscope sensor produces a compressed data stream by compressing the digital data of the analog-to-digital converter;

transmitting the respective compressed data stream is transmitted via the data output interface from the microscope to the user computer in real-time whereas the raw data stream is not transmitted to the user computer in real-time;

transmitting a respective raw data stream comprising digital data that were not compressed, or at least compressed to a lesser extent than the compressed data stream, via the data output interface to a data memory;

wherein the user computer calculates and presents real-time images from the compressed data stream and reads and processes the raw data stream from the data memory, or a raw data stream derived therefrom from the data memory, for a subsequent data analysis.

13. The method as claimed in claim 12, further comprising transmitting the raw data stream or a part thereof from the data memory to the user computer only when the recording of sample signals by the at least one measurement device has terminated and no more compressed data stream is transferred from the at least one microscope sensor to the user computer.

* * * * *

UNITED STATES PATENT AND TRADEMARK OFFICE
CERTIFICATE OF CORRECTION

PATENT NO. : 11,381,774 B2
APPLICATION NO. : 16/603960
DATED : July 5, 2022
INVENTOR(S) : Andreas Kühm and Nico Presser It is certified that error appears in the above-identified patent and that said Letters Patent is hereby corrected as shown below:

In the Specification

Column 1, Line 56  now reads: "respective microscope sensor in this ease records sample"
should read -- respective microscope sensor in this case records sample --

Column 2, Line 32  now reads: "compression algorithm or PEG compression. However,"
should read -- compression algorithm or JPEG compression. However, --

Column 8, Line 9  now reads: "raw data stream 28, and the respective compressed data"
should read -- raw data stream 28, 38, and the respective compressed data --

Signed and Sealed this
Eleventh Day of October, 2022

Katherine Kelly Vidal
*Director of the United States Patent and Trademark Office*